United States Patent
Kim (10) Patent No.: US 8,227,897 B2
(45) Date of Patent: Jul. 24, 2012

(54) INTEGRATED CIRCUIT RESISTIVE DEVICES INCLUDING MULTIPLE INTERCONNECTED RESISTANCE LAYERS

(75) Inventor: Jongwon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 365 days.

(21) Appl. No.: 12/699,558

(22) Filed: Feb. 3, 2010

(65) Prior Publication Data

US 2010/0224962 A1     Sep. 9, 2010

(30) Foreign Application Priority Data

Mar. 3, 2009   (KR) ................ 10-2009-0018135

(51) Int. Cl.
  *H01L 29/00*     (2006.01)
(52) U.S. Cl. ............ 257/536; 257/E27.016; 338/22 SD
(58) Field of Classification Search .............. 257/536, 257/E27.016; 338/22 SD
  See application file for complete search history.

(56) References Cited

U.S. PATENT DOCUMENTS

| | | | | |
|---|---|---|---|---|
| 4,805,147 A | * | 2/1989 | Yamanaka et al. | ............ 365/154 |
| 2007/0229210 A1 | * | 10/2007 | Higuchi et al. | ........... 338/22 SD |

FOREIGN PATENT DOCUMENTS

| | | |
|---|---|---|
| JP | 2006-186038 | 7/2006 |
| KR | 10-2007-0069424 A | 7/2007 |
| KR | 10-2007-0082991 A | 8/2007 |

OTHER PUBLICATIONS

Fukuzumi et al. "Optimal Integration and Characteristics of Vertical Array Devices for Ultra-High Density, Bit-Cost Scalable Flash Memory," *IEEE International Electron Devices Meeting*, pp. 449-452 (2007).

Tanaka et al. "Bit Cost Scalable Technology With Punch and Plug Process for Ultra High Density Flash Memory" *IEEE Symposium on VLSI Technology Digest of Technical Papers*, pp. 14-15 (2007).

* cited by examiner

*Primary Examiner* — Tu-Tu Ho (74) *Attorney, Agent, or Firm* — Myers Bigel Sibley & Sajovec, P.A.

(57) ABSTRACT

A semiconductor device includes a semiconductor substrate comprising a cell region and a peripheral circuit region, a first resistance layer and a second resistance layer spaced apart from each other and sequentially stacked on the semiconductor substrate of the peripheral circuit region, a first plug connected to the first resistance layer, and a second plug connected to the first and second resistance layers in common.

16 Claims, 11 Drawing Sheets

INTEGRATED CIRCUIT RESISTIVE DEVICES INCLUDING MULTIPLE INTERCONNECTED RESISTANCE LAYERS

CROSS-REFERENCE TO RELATED APPLICATION

This application claims priority under 35 U.S.C. §119 to Korean Patent Application No. 10-2009-0018135, filed on Mar. 3, 2009, the disclosure of which is hereby incorporated herein by reference in its entirety as if set forth fully herein.

BACKGROUND OF THE INVENTION

The present disclosure relates to integrated circuit devices such as semiconductor devices and, more particularly, to integrated circuit devices including a resistance device.

Integrated circuits are widely used in many consumer, commercial and other applications. The integration density of integrated circuit devices continues to increase, so that more and more active devices, such as transistors, and passive devices, such as resistors, may be included in a given integrated circuit, also referred to as a "chip."

Resistance devices, also referred to as "resistors" or "resistive devices," are widely used in integrated circuit devices to provide, for example, delay control and/or high voltage control in integrated circuit devices. It may be desirable to provide a resistance device having a large resistance and/or a plurality of different resistances that may be selected. Unfortunately, a resistance device having a large resistance and/or a plurality of different resistances may occupy an excessive area of an integrated circuit device.

SUMMARY OF THE INVENTION

Various embodiments described herein provide a semiconductor device. The semiconductor device may include a semiconductor substrate comprising a first region and a second region; a first resistance layer and a second resistance layer spaced apart from each other and sequentially stacked on the semiconductor substrate of the first region; a first plug connected to the first resistance layer; and a second plug connected to the first and second resistance layers in common.

In certain embodiments, the semiconductor device further comprises a third plug connected to the second resistance layer.

In certain embodiments, the semiconductor device further comprises a third resistance layer spaced apart from the second resistance layer and stacked on the second resistance layer, wherein the third resistance layer is connected to the third plug.

In certain embodiments, two plugs among the plugs are connected to each other to provide a resistance device.

In certain embodiments, the second resistance layer has a width smaller than that of the first resistance layer to expose a portion of the first resistance layer.

In certain embodiments, the first plug is provided to one end of the first resistance layer.

In certain embodiments, the second plug is provided to the other end facing the one end of the first resistance layer.

In certain embodiments, the plugs are formed of material having conductivity greater than the resistance layers.

In certain embodiments, the semiconductor device further comprises a lower select gate, a plurality of control gates and an upper select gate that are sequentially stacked on the semiconductor substrate of the second region, wherein the first resistance layer comprises material provided by the same deposition process as the lower select gate.

In certain embodiments, the semiconductor device further comprises a plurality of other resistance layers formed on the second resistance layer, wherein the uppermost resistance layer among the plurality of other resistance layers comprises material by the same deposition process as the upper select gate.

Devices according to other embodiments described herein include a first resistance layer and a second resistance layer that are stacked upon one another in spaced-apart relation on a substrate. A first conductive plug is connected to the first resistance layer, but is free of connection to the second resistance layer. A second conductive plug is connected to both the first and second resistance layers. In other embodiments, a third conductive plug is connected to the second resistance layer, but is free of connection to the first resistance layer. In still other embodiments, a third resistance layer is provided, that is spaced apart from the second resistance layer and is stacked upon the second resistance layer, wherein the third resistance layer is connected to the third conductive plug. In other embodiments, two of the conductive plugs are selected to provide a resistance device.

In still other embodiments, a lower select gate, a plurality of control gates, and an upper select gate are also sequentially stacked upon one another on the substrate and laterally spaced apart from the first and second resistance layers. The first resistance layer and the lower select gate comprise portions of a common layer. In other embodiments, an uppermost resistance layer among the plurality of resistance layers and the upper select gate comprise portions of a common layer.

Devices according to still other embodiments described herein include a substrate and first, second and third resistance layers that are stacked upon one another in closely spaced-apart relation on the substrate. The second resistance layer is narrower than the first resistance layer so as to expose a portion of the first resistance layer. The third resistance layer is narrower than the second resistance layer so as to expose a portion of the second resistance layer. A first conductive plug is connected to the exposed portion of the first resistance layer and to the second resistance layer, but is free of connection to the third resistance layer. A second conductive plug is connected to the exposed portion of the second resistance layer and to the third resistance layer, but is free of connection to the first resistance layer.

In some embodiments, the first and second conductive plugs are on opposite ends of the second resistance layer. In other embodiments, a lower select gate, a plurality of control gates and an upper select gate are stacked upon one another in closely spaced-apart relation on the substrate and are laterally spaced apart from the first, second and third resistance layers. In some embodiments, the first resistance layer and the lower select gate comprise portions of a common layer. In other embodiments, the third resistance layer and the upper select gate comprise portions of a common layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element is referred to as being "on," "upon," "connected," "coupled" or "responsive" to another element (or variations thereof), it can be directly on, upon, connected, coupled or responsive to the other element, or intervening elements may be present. In contrast, when an element is referred to as being "directly on," "directly upon," "directly connected," "directly coupled" or "directly responsive" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower," "upper," "horizontal," "lateral" and "vertical" (or variations thereof) may be used herein to describe one element's relationship to another element as illustrated in the Figures. It will be understood that relative terms are intended to encompass different orientations of the device in addition to the orientation depicted in the Figures. For example, the terms "horizontal" and "vertical" are used to refer to two generally orthogonal directions, but do not imply a specific orientation.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Figure 1:
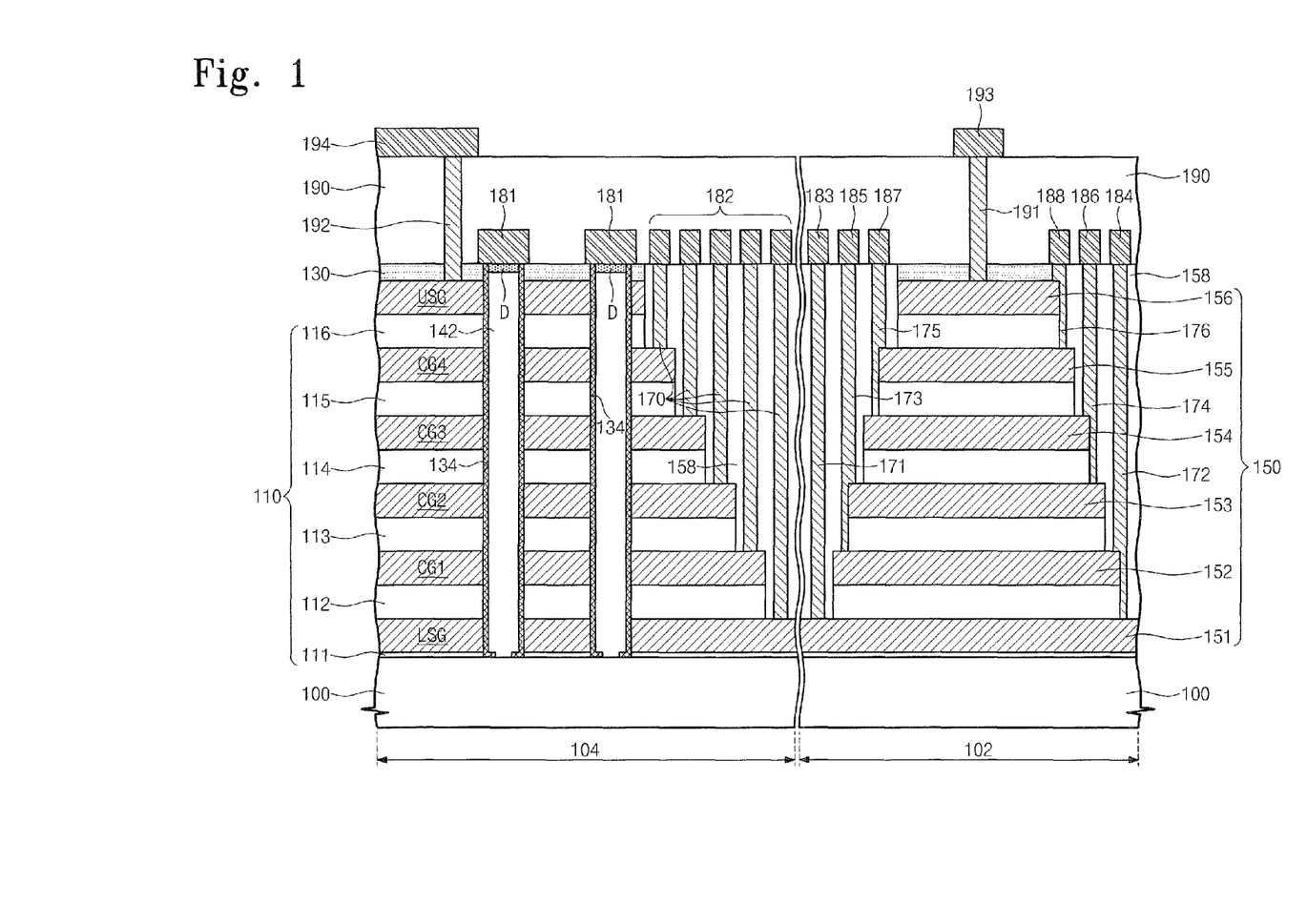
FIG. 1 is a cross sectional view illustrating a semiconductor device in accordance with various embodiments.
Figure 2:
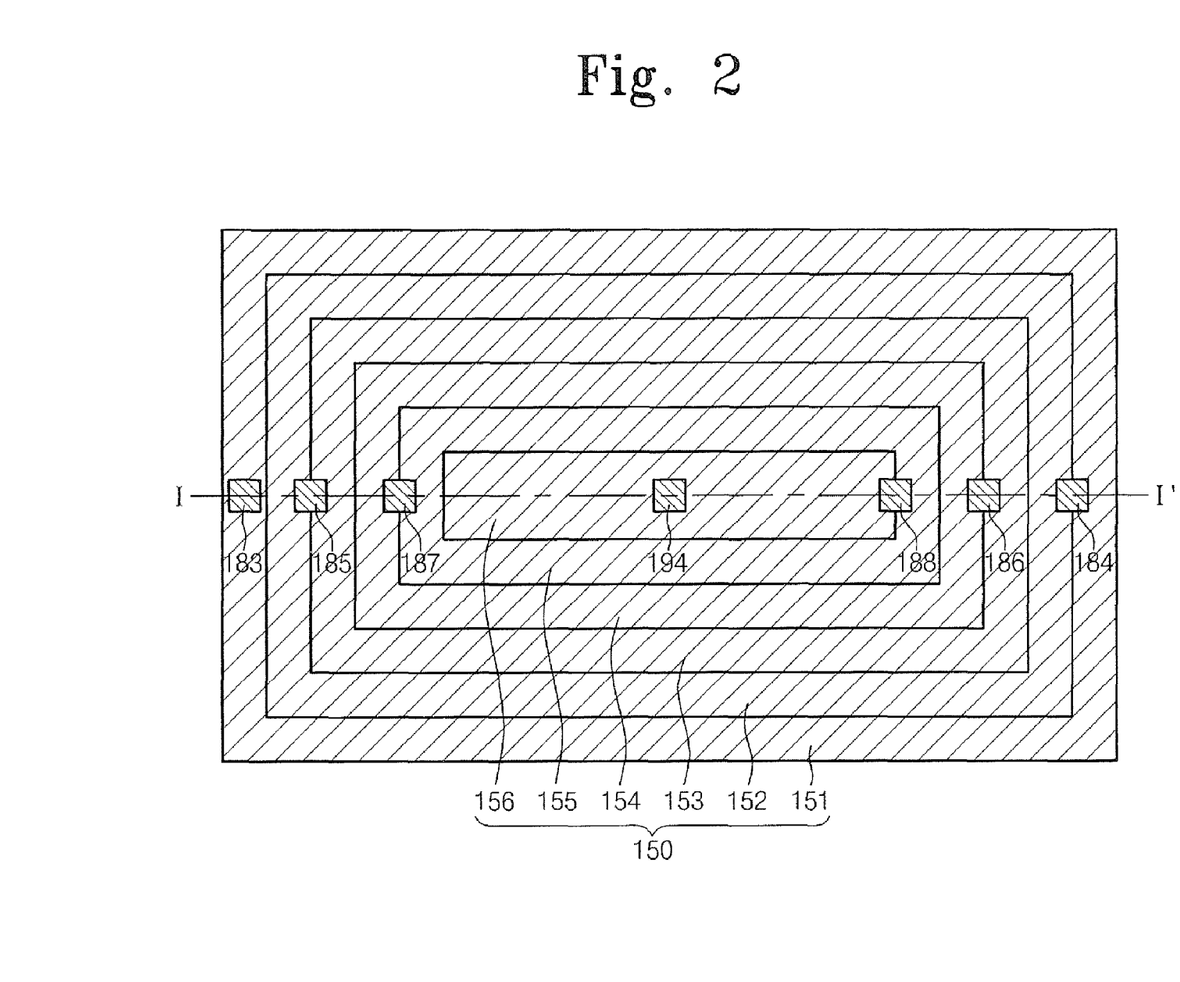
FIG. 2 is a top plan view illustrating a semiconductor device in accordance with various embodiments.

FIG. 1 is a cross sectional view illustrating an integrated circuit such as a semiconductor device in accordance with various embodiments. FIG. 2 is a top plan view illustrating an integrated circuit such as a semiconductor device in accordance with various embodiments.

Referring to FIGS. 1 and 2, an integrated circuit substrate such as a semiconductor substrate 100 including a first region 102 and a second region 104 may be prepared. The substrate may include one or more single element and/or compound semiconductor substrates and/or layers. A resistance device may be disposed in the first region 102 and memory cells may be disposed in the second region 104. A first resistance layer 151 and a second resistance layer 152 which are sequentially stacked and spaced apart from each other may be disposed on the semiconductor substrate 100 of the first region 102. A first interlayer insulating pattern 111 may be disposed between the semiconductor substrate 100 and the first resistance layer 151 and a second interlayer insulating pattern 112 may be disposed between the first and second resistance layers 151 and 152. The second resistance layer 152 may have a width smaller (i.e., may be narrower) than the first resistance layer 151 so as to expose a portion of the first resistance layer 151. More specifically, the first and second resistances 151 and 152 may have a stair shape. The first interlayer insulating pattern 111 disposed between the semiconductor substrate 100 and the first resistance layer 151 may have the same width as the first resistance layer 151 and the second interlayer insulating pattern 112 disposed between the first and second resistance layers 151 and 152 may have the same width as the second resistance layer 152.

A first plug 171 connected to the first resistance layer 151 may be disposed to be separated from the second resistance layer 152. Stated differently, the first plug 171 is free of connection to the second resistance layer 152. The first plug 171 may be provided at one end of the first resistance layer 151. A second plug 172 connected in common to the first and second resistance layers 151 and 152 may be provided. The second plug 172 may be provided at the other end of the first resistance layer 151. A third plug 173 connected to the second resistance layer 152 may be provided. The third plug 173 is free of connection to the first resistance layer 151. The third plug 173 may be provided to the other end facing one end of the second resistance layer 152 on which the second plug 172 is formed.

The first through third plugs 171 through 173 and the first and second resistance layers 151 and 152 may constitute a resistance device. That is, a resistance device may be provided by selecting two plugs among the first through third plugs 171 through 173. For example, when the first and third plugs 171 and 173 are selected, a resistance device connected from one end of the first resistance layer 151 on which the first plug 171 is formed to the other end of the second resistance layer 152 on which the third plug 173 is formed may be provided. The resistance device may include the upper and lower resistance layers vertically spaced apart from each other and stacked, and may be comprised of the plugs connecting the upper and lower resistance layers. That is, the resistance device may have a vertical multilayer structure connected from one end of the lower resistance layer to the other end of the lower resistance layer, to one end of the upper resistance layer and the other end of the upper resistance layer. Thus, a large resistance can be embodied in the same area, thereby making it possible to increase integration of a semiconductor device.

A third resistance layer 153 is further disposed on the second resistance layer 152 and the third resistance layer 153 may be connected to the third plug 173. A third interlayer insulating pattern 113 is interposed between the second and third resistance layers 152 and 153 to vertically separate the second and third resistance layers 152 and 153. The third resistance layer 153 may have a width smaller (i.e., be narrower) than the second resistance layer 152 so as to expose a portion of the second resistance layer 152. More specifically, the second and third resistance layers 152 and 153 may have a stair shape and the third interlayer insulating pattern 113 may have the same width as the third resistance layer 153. Also, a fourth plug 174 connected to the third resistance layer 153 may be provided. The fourth plug 174 may be provided at the other end facing one end of the third resistance layer 153 on which the third plug 173 is formed. When the first and fourth plugs 171 and 174 are selected to provide a resistance device, a resistance device of a vertical multilayer structure connected to the first resistance layer 151, the second resistance layer 152 and the third resistance layer 153 may be provided.

Fourth through sixth resistance layers 154 through 156 separated from one another by fourth through sixth interlayer insulating layers 114 through 116 and stacked may be further disposed on the third resistance layer 153. The fourth through sixth resistance layers 154 through 156 may be connected to fifth and sixth plugs 175 and 176 as described above. The first through sixth resistance layers 151 through 156 may constitute resistance layers 150 and the first through sixth interlayer insulating layers 111 through 116 may constitute interlayer insulating patterns 110. The resistance layers 150 and the first through sixth plugs 171 through 176 may provide a resistance device as described above. Although six resistance layers are disposed in the drawing, resistance layers more or less than six may exist and plugs connecting the resistance layers may be further provided.

Since the resistance device includes the resistance layers 150 and the first through sixth plugs 171 through 176 connecting the resistance layers 150, the number of the resistance layers 150 which the resistance device includes may become different according to a selection of the first through sixth plugs 171 through 176. Accordingly, a resistance of the resistance device may become different according to a selection of the first through sixth plugs 171 through 176 and various resistances may be embodied using the same resistance device.

The first through sixth plugs 171 through 176 may be formed of material having conductivity greater than the resistance layers 150. Stated differently, they are conductive plugs. The first through sixth plugs 171 through 176 may be connected to first region conductive patterns 183 through 188 on a first insulating layer 158 respectively. A mask layer 130 may be disposed on the sixth resistance layer 156 disposed on the uppermost portion among the resistance layers 150. The mask layer 130 may be used as an etch stop layer. The sixth resistance layer 156 may be connected to a first region via plug 191 penetrating a second insulating layer 190 and the first region via plug 191 may be connected to a first region interconnection pattern 193.

A lower select gate (LSG), a plurality of control gates (CG1-CG4) and an upper select gate (USG) may be disposed on the semiconductor substrate 100 of the second region 104. Although four control gates are illustrated in the drawing, control gates more or less than four may be provided.

The first resistance layer 151 of the lowermost layer formed on the first region 102 may include material provided by the same deposition process as the lower select gate (LSG) formed on the second region 104. Thus, the first resistance layer 151 and the LSG may comprise portions of a common layer. Also, the sixth resistance layer 156 of the uppermost layer may include material provided by the same deposition process as the upper select gate (USG). When a plurality of resistance layers further exist on the first resistance layer 152, the uppermost resistance layer may include material provided by the same deposition process as the upper select gate (USG). Thus, the sixth or uppermost resistance layer 156 and the USG may comprise portions of a common layer.

The gates (USG, CG1-CG4, LSG) that are spaced apart from one another by the interlayer insulating patterns 110 and stacked may have widths of the upper gate and the interlayer insulating pattern smaller than those of the lower gate and the interlayer insulating pattern so that the upper gate and the interlayer insulating pattern expose a portion of the lower gate and the interlayer insulating pattern. For example, the gates (USG, CG1-CG4, LSG) and the interlayer insulating patterns 111 through 116 may have a structure of a stair shape having a narrowing width as they approach the upper portion. The mask layer 130 may be disposed on the upper select gate (USG).

The semiconductor device includes active pillars 142 penetrating the interlayer insulating patterns 110 and the gates (USG, CG1-CG4, LSG) and the active pillars 142 may be disposed to be in contact with a top surface of the semiconductor substrate 100. A gate insulating layer 134 may be disposed between the active pillars 142 and sidewalls of the gates (USG, CG1-CG4, LSG). The gate insulating layer 134 may be disposed between the active pillars 142 and sidewalls of the interlayer insulating patterns 110. A drain region (D) may be disposed on the active pillars 142. Bit line conductive patterns 181 may be disposed on an upper portion of the active pillar 142. The bit line conductive patterns 181 may be disposed on the drain region (D).

The control gates (CG1-CG4) and the lower select gate (LSG) may be connected to second region conductive patterns 182 disposed on the first insulating layer 158 by gate plugs 170. The upper select gate (USG) may be connected to a second region interconnection pattern 194 by a second region via plug 192 penetrating the interlayer insulating layer 190.

FIG. 3A through 3H are cross sectional views illustrating methods of forming a semiconductor device in accordance with various embodiments.

Figure 3A:
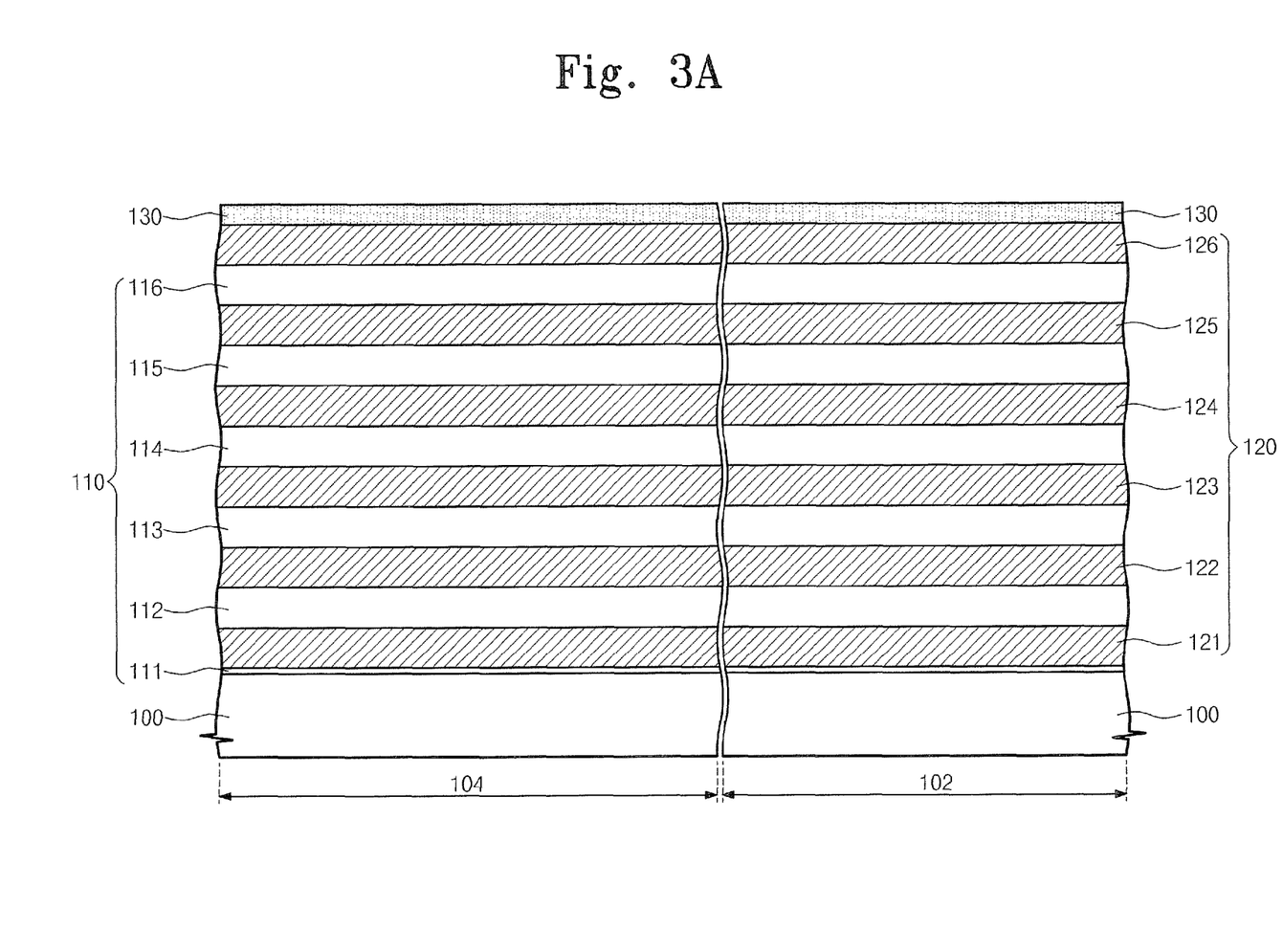
FIG. 3A through 3H are cross sectional views illustrating methods of forming a semiconductor device in accordance with various embodiments.

Referring to FIG. 3A, a semiconductor substrate 100 including a first region 102 and a second region 104 is prepared. A peripheral circuit, for example, a resistance device, may be formed on the first region 102 and memory cells may be formed on the second region 104. The semiconductor substrate 100 may include a semiconductor (e.g., a p-type silicon wafer) of a single crystalline structure. However, other single and/or compound semiconductor substrates and/or layers may be used. The semiconductor substrate 100 may include a region electrically isolated by impurity regions of a different conductivity type. Interlayer insulating patterns 110 and the material layers 120 may be alternately formed on the semiconductor substrate 100. As a result, the material layers 120 spaced apart from one another by the interlayer insulating patterns 110 and stacked may be formed.

The material layers 120 may be formed of one or more conductive materials, for example, doped polysilicon. Although six material layers 150 are illustrated in the drawing, material layers more or less than six may be further provided.

A mask layer 130 may be formed on the material layer 126 of the uppermost layer. The mask layer 130 may include a silicon nitride layer which can be used as an etch stop layer. The interlayer insulating layers 110 may include a silicon oxide layer formed using a chemical vapor deposition (CVD) method, a physical vapor deposition (PVD) method and/or an atomic layer deposition (ALD).

Figure 3B:
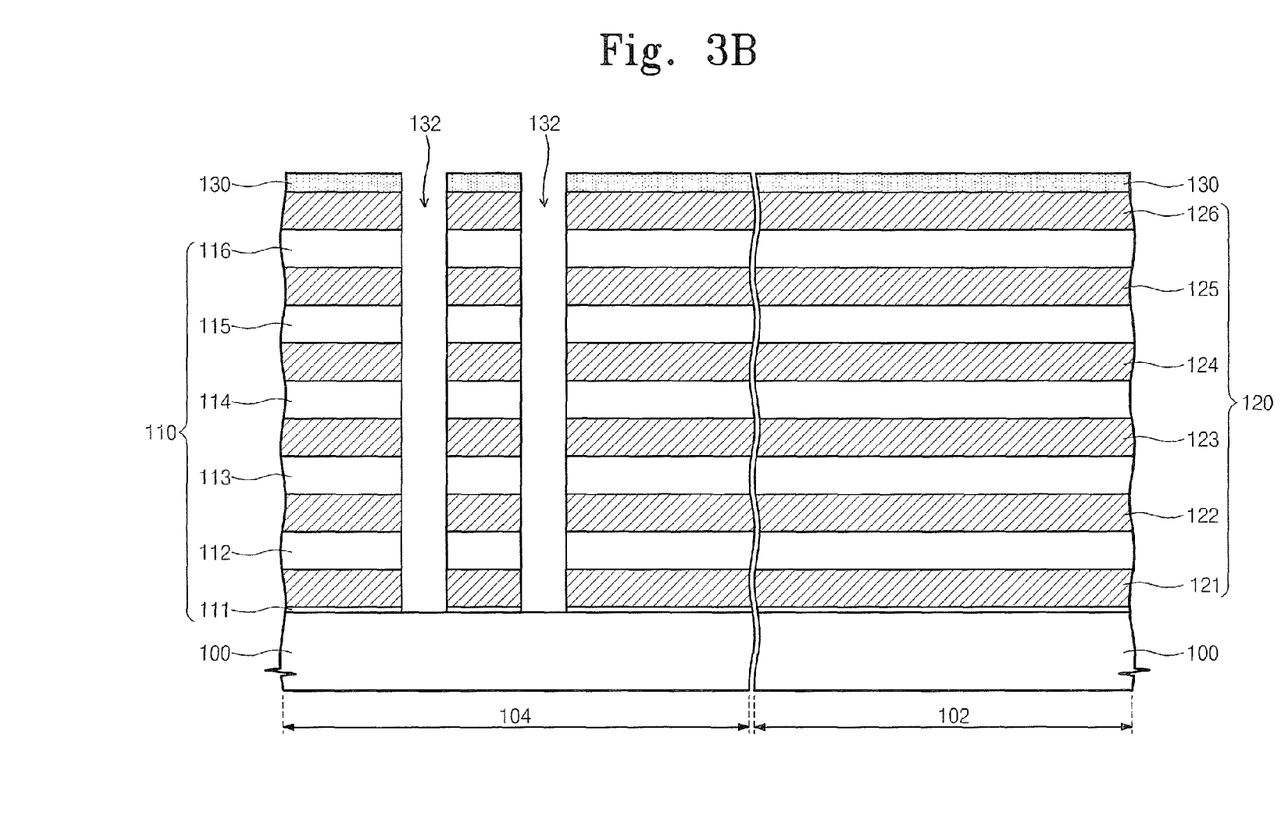

Referring to FIG. 3B, the mask layer 130, the material layers 120 and the interlayer insulating patterns 110 are patterned to form first openings 132 exposing a top surface of the semiconductor substrate 100.

If the openings 132 are formed to be inclined, a length of a channel of a cell formed on the second region 104 may become different. To reduce or minimize that, a patterning process for forming the openings 132 may be performed by using an anisotropic etching technique so that the openings 132 have vertical sidewalls.

Figure 3C:
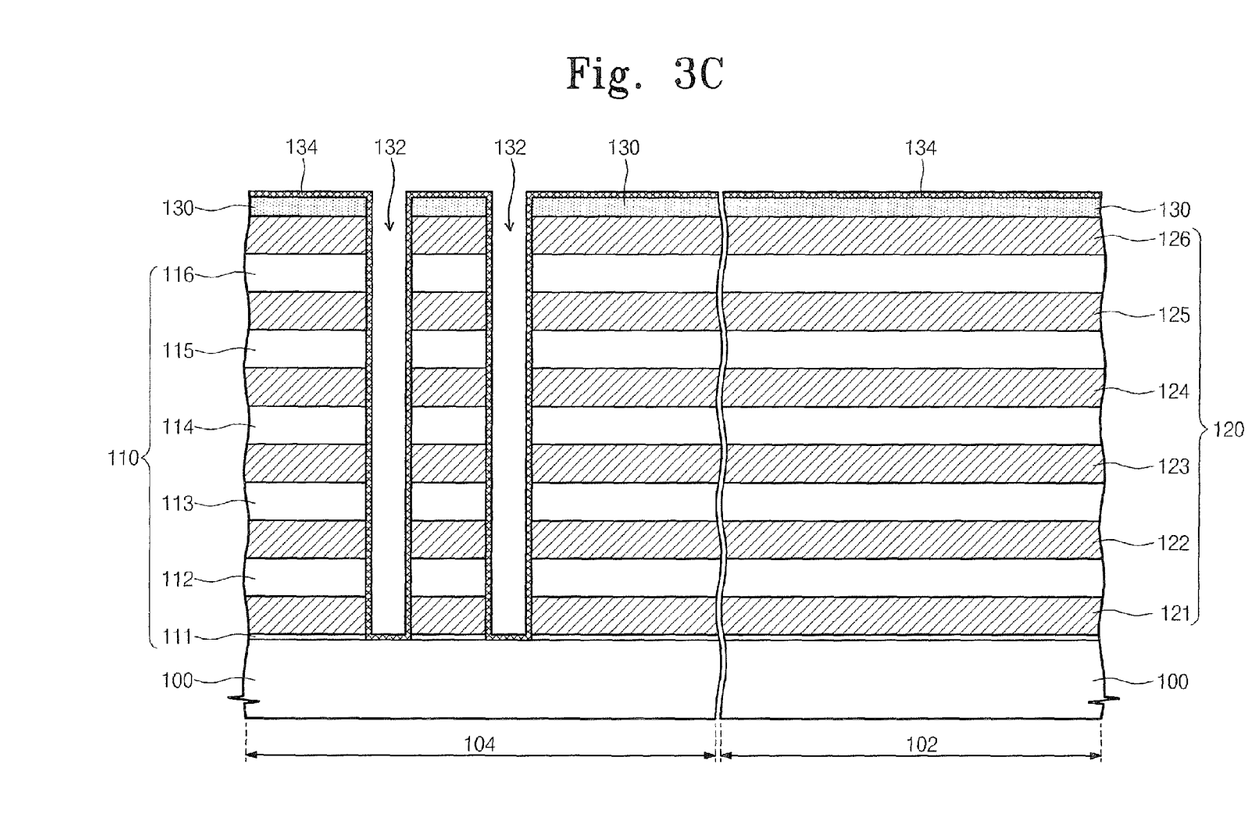

Referring to FIG. 3C, a gate insulating layer 134 may be conformally formed on insides of the openings 132. The gate insulating layer 134 may be formed on the mask layer 130 of the first region 102 and the second region 104. The gate insulating layer 134 may be a silicon oxide layer and/or a silicon nitride layer. The gate insulating layer 134 may include a thin film for storing data. For example, the gate insulating layer 134 may include a blocking insulating layer, a charge storage layer and a tunnel insulating layer that are sequentially stacked. The charge storage layer may include a silicon nitride layer and/or a silicon oxynitride layer including charge trap sites and can be used as a thin film for storing data. The tunnel insulating layer may include a thermal oxide layer and/or a silicon oxide layer formed by a chemical vapor deposition (CVD) method. The blocking insulating layer may include at least one material having a dielectric constant higher than the tunnel insulating layer.

Figure 3D:
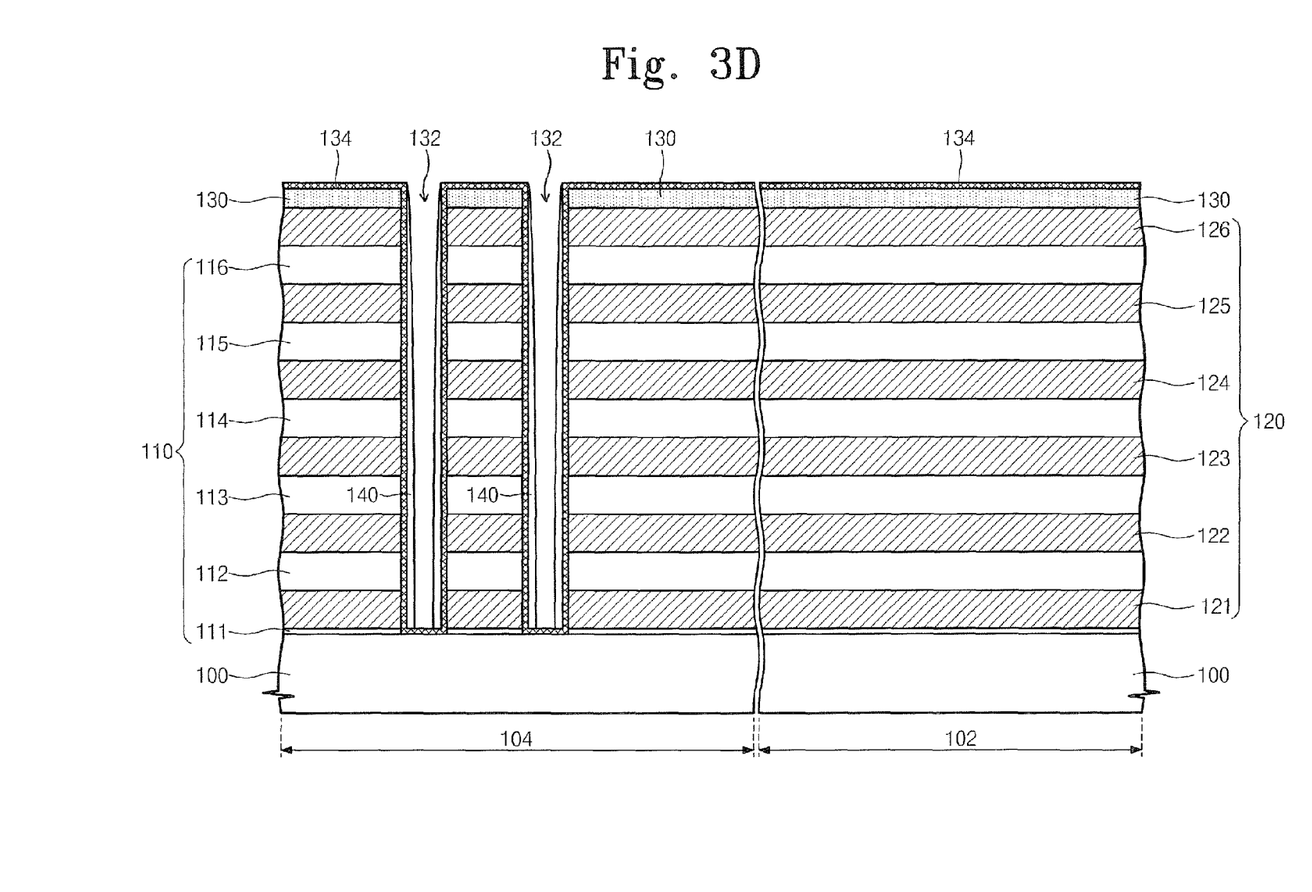

Referring to FIG. 3D, a spacer 140 may be formed on insides of the openings 132 as an etching mask. The spacer 140 may be formed to cover the gate insulating layer 134 in the openings 132. Thus, an etching damage of the gate insulating layer 134 may be reduced or minimized in a subsequent patterning process etching the gate insulating layer 134. The spacer 140 may comprise material which can be removed while reducing or minimizing an etching damage of the gate insulating layer 134. For example, when the gate insulating layer 134 is a silicon oxide layer, the spacer 140 may be formed of a silicon nitride layer.

Figure 3E:
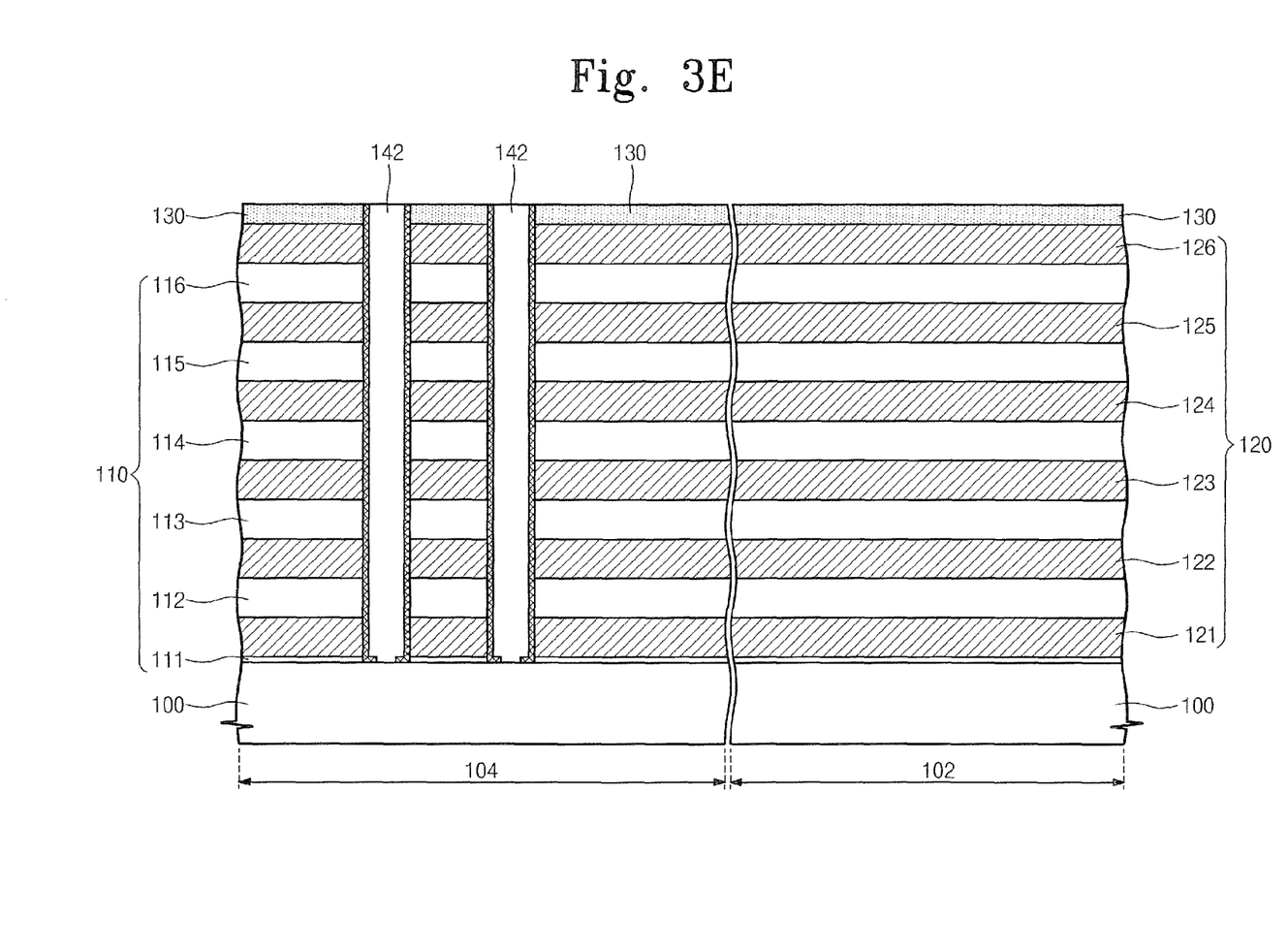

Referring to FIG. 3E, the exposed gate insulating layer 134 may be removed using the spacer 140 as an etching mask. The top surface of the semiconductor substrate 100 may be exposed at bottoms of the openings 132. After that, the spacer 140 may be removed.

Subsequently, active pillars 142 filling the openings 132 may be formed. The active pillars 142 may be formed of the same material as the semiconductor substrate 100. For example, the active pillars 142 and the semiconductor substrate 100 may be silicon of a single crystalline structure continuously connected. Forming the active pillars 142 may use epitaxial techniques. Thus, the active pillars 142 may be grown from the semiconductor substrate 100.

Figure 3F:
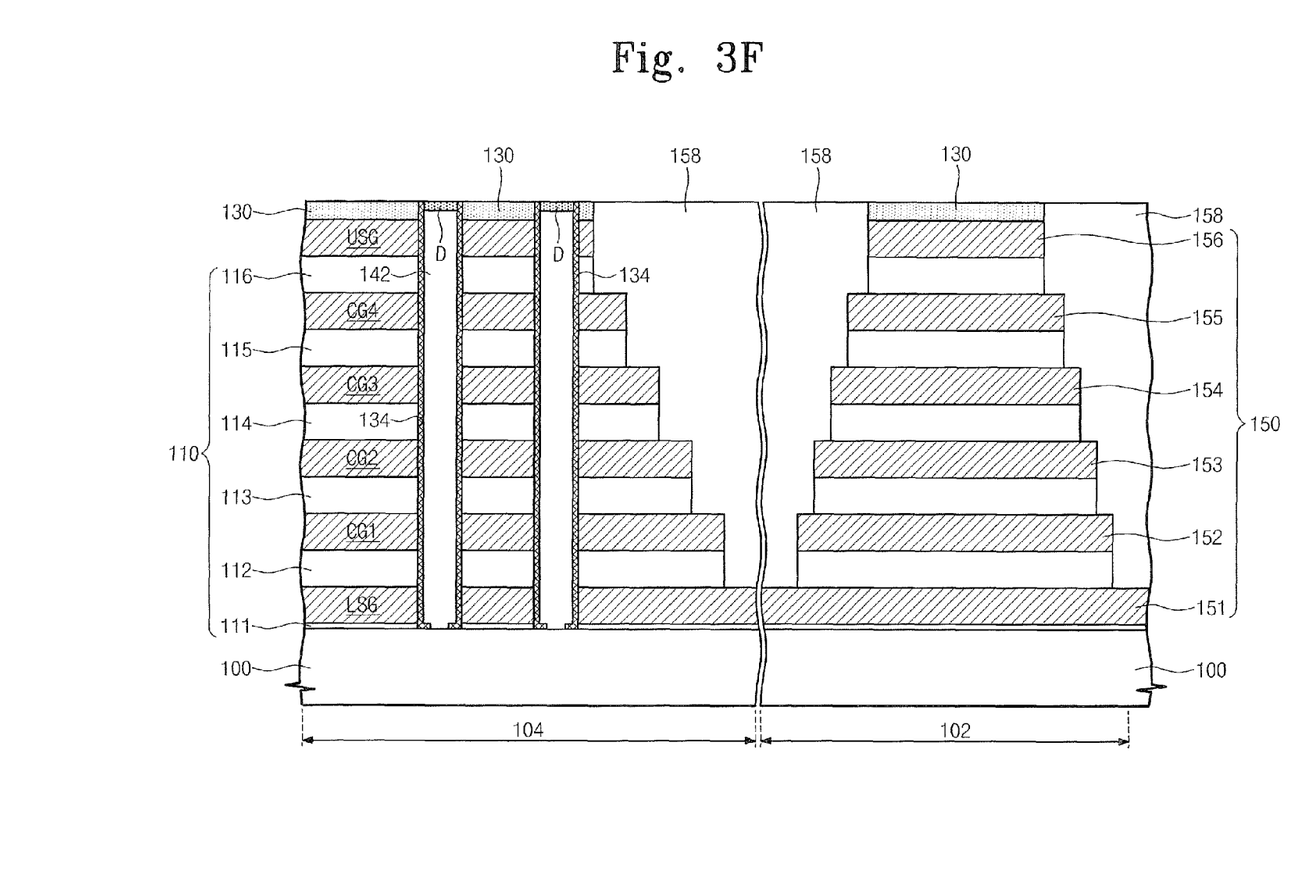

Referring to FIG. 3F, an etching process may be performed on the material layers 120 and the interlayer insulating patterns 110 formed on the first region 102 and the second region 104. Due to the etching process, the material layers 120 and the interlayer insulating patterns 110 may have a structure of a stair shape having a narrowing width as they approach the upper portion. The material layers 120 having a stair structure of the first region 102 may constitute resistance layers 150. The material layer 126 of the uppermost layer of the second region 104 may constitute an upper select gate (USG) and the material layer 121 of the lowermost layer of the second region 104 may constitute a lower select gate (LSG). The material layers 122 through 125 disposed between the material layers 121 and 126 of the uppermost layer and the lowermost layer of the second region 104 may constitute the control gates (CG1-CG4).

A first insulating layer 158 may be formed on the semiconductor substrate 100 of the first region 102 and the second region 104. The first insulating layer 158 may include a silicon oxide layer formed by a chemical vapor deposition (CVD) method, a physical vapor deposition (PVD) method and/or an atomic layer deposition (ALD) method. After the first insulating layer 158 is formed, a planarization process may be performed using the mask layer 130 as an etch stop layer. The planarization process may be performed using a chemical mechanical polishing (CMP) process and/or an etch-back process.

An impurity is implanted into an upper portion of the exposed active pillars 142 to form a drain region (D). The material layer 126 of the uppermost portion of the second region 104 is patterned to form the upper select gate (USG) line. The upper select gate (USG) can connect the active pillars 142 to one another one dimensionally. An insulating layer is formed on the upper select gate (USG), and then a planarization process is performed on the insulating layer to electrically isolate the upper select gate (USG) line.

Figure 3G:
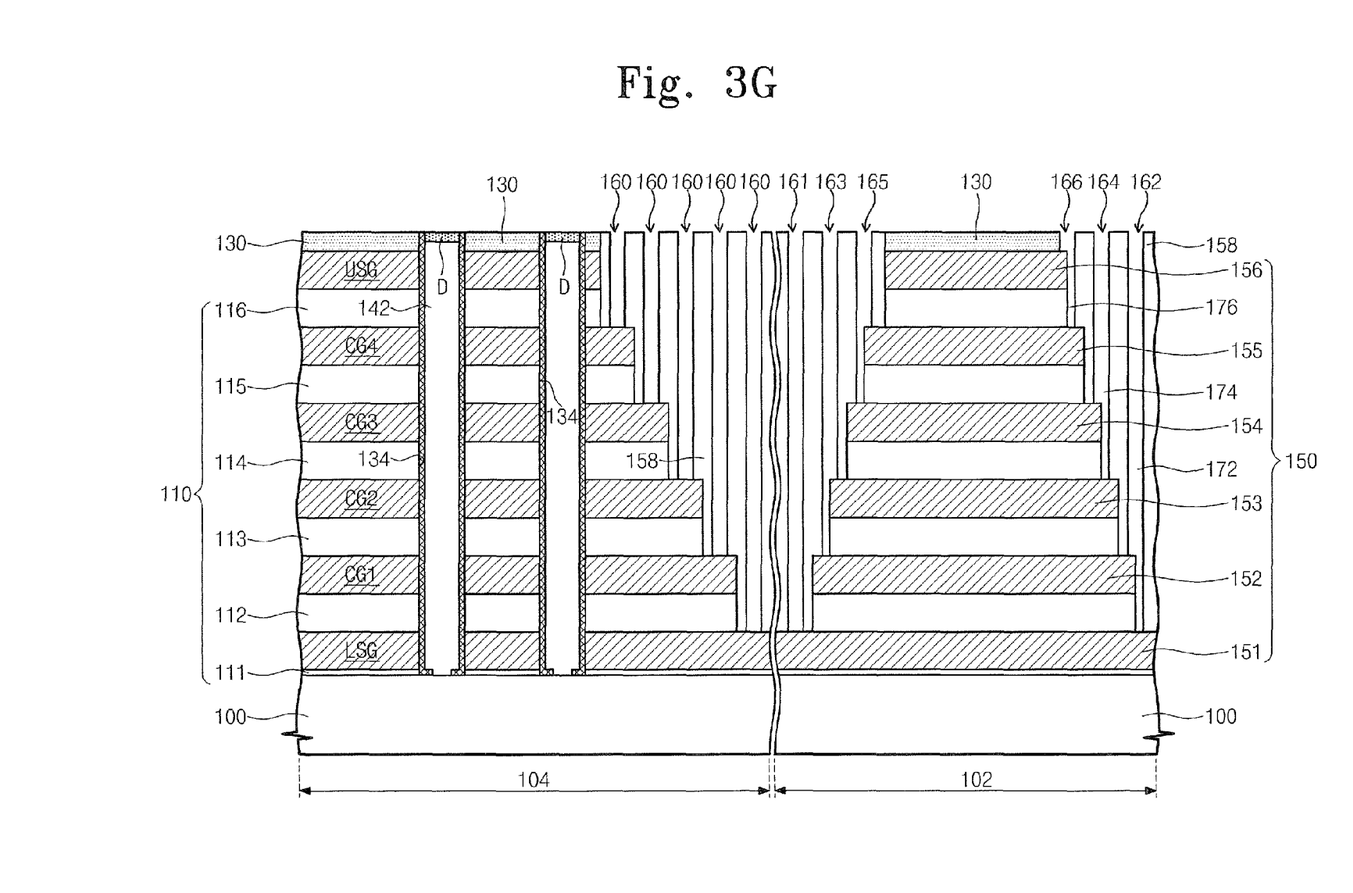

Referring to FIG. 3G, the first insulating layer 158 is patterned to form first through sixth contact holes 161 through 166 on the first region 102. The resistance layers 150 may include one end and the other end opposite the one end (i.e., opposite ends). The first contact hole 161 penetrating the first insulating layer 158 and exposing one end of the first resistance layer 151 may be formed. The second contact hole 162 may be formed to concurrently expose the other end of the first resistance layer 151 and one end of the second resistance layer 152. The third contact hole 163 may be formed to concurrently expose the other end of the second resistance layer 152 and one end of the third resistance layer 153. The fourth contact hole 164 may be formed to concurrently expose the other end of the third resistance layer 153 and one end of the fourth resistance layer 154. The fifth contact hole 165 may be formed to concurrently expose the other end of the fourth resistance layer 154 and one end of the fifth resistance layer 155. The sixth contact hole 166 may be formed to concurrently expose the other end of the fifth resistance layer 155 and one end of the sixth resistance layer 156. Although six resistance layers are illustrated in the drawing, the resistance layers more or less than six can be provided and more or less contact holes can be formed.

The first insulating layer 158 is patterned to form gate contact holes 160 exposing a portion of the control gates (CG1-CG4) and a portion of the lower select gate (LSG).

Figure 3H:
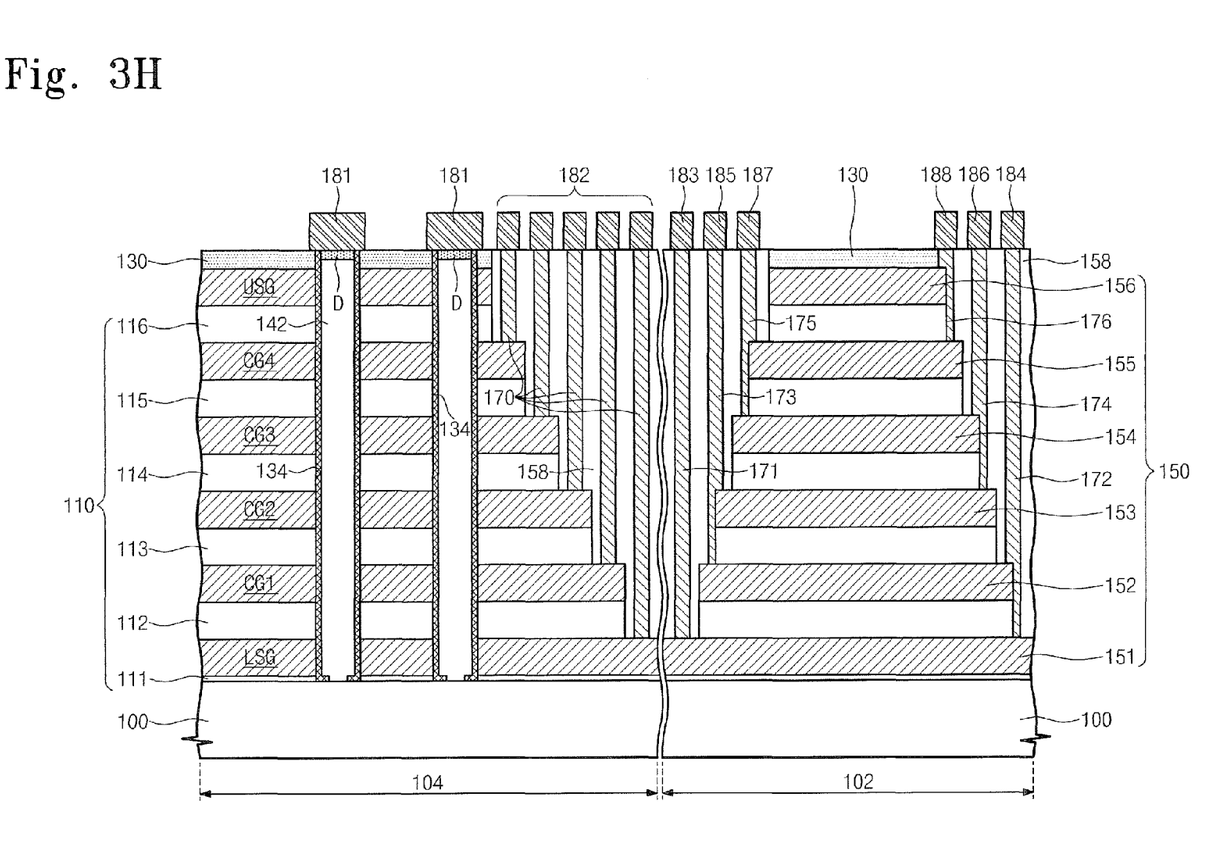

Referring to FIG. 3H, a first conductive layer may be formed on the semiconductor substrate 100 including in the first through sixth contact holes 161 through 166 and in the gate contact holes 160. The first conductive layer may include tungsten formed by a chemical vapor deposition (CVD), a physical vapor deposition (PVD) and/or an atomic layer deposition (ALD). A planarization process is performed using the mask layer 130 as an etch stop layer. The planarization process may be performed by a chemical mechanical polishing (CMP) and/or an etch-back process. First through sixth plugs 171 through 176 may be formed by filling the first through sixth contact holes 161 through 166, respectively. Also, gate plugs 170 may be formed by filling the gate contact holes 160. The first through sixth plugs 171 through 176 and the gate plugs 170 may be formed of material having conductivity greater than the resistance layers 150, i.e., a conductive material.

A second conductive layer may be formed on the semiconductor substrate 100. The second conductive layer may include aluminum formed by a chemical vapor deposition (CVD), a physical vapor deposition (PVD) and/or an atomic layer deposition (ALD). The second conductive layer of the first region 102 is patterned to form first region conductive patterns 183 through 188 connected to the first through sixth plugs 171 through 176. The second conductive layer of the second region 104 is patterned to form second region conductive patterns 182 connected to the gate plugs 170 and bit line conductive patterns 181 connected to the drain region (D).

A method of forming a semiconductor device in accordance with various embodiments is described with reference to FIG. 1.

Referring to FIG. 1, a second insulating layer 190 may be formed on the semiconductor substrate 100 on which the bit line conductive patterns 181, the second region conductive patterns 182 and the first region conductive patterns 183 through 188 are formed. The second insulating layer 190 may include a silicon oxide layer formed by a chemical vapor deposition (CVD), a physical vapor deposition (PVD) and/or an atomic layer deposition (ALD).

The second insulating layer 190 and the mask layer 130 of the first region 102 are patterned to form a first region via contact hole exposing the sixth resistance layer 156. Also, the second insulating layer 190 and the mask layer 130 of the second region 104 are patterned to form a second region via contact hole exposing the upper select gate (USG).

Subsequently, a third conductive layer may be formed on the second insulating layer 190. The third conductive layer may include tungsten formed by a chemical vapor deposition (CVD), a physical vapor deposition (PVD) and/or an atomic layer deposition (ALD). A planarization process is performed using the second insulating layer 190 as an etch stop layer to form a first region via plug 191 and a second region via plug 192.

A fourth conductive layer may be formed on the second insulating layer 190. The fourth conductive layer may include aluminum formed by a chemical vapor deposition (CVD), a physical vapor deposition (PVD) and/or an atomic layer deposition (ALD). The fourth conductive layer is patterned to form a first region interconnection pattern 193 connected to the first region via plug 191 and a second region interconnection pattern 194 connected to the second region via plug 192.

As a result, a resistance device including the resistance layers 150 vertically spaced apart from one another and stacked, and the first through sixth plugs 171 through 176 connecting the resistance layers 150 to one another may be formed on the first region 102. A resistance device may be provided by selecting two plugs among the first through sixth plugs 171 through 176. For example, when the first plug 171 and the third plug 173 are selected, the resistance device can embody a resistor connected to the first resistance layer 151 to which the first plug 171 is connected and the second resistance layer 152 to which the third plug 173 is connected. The resistance device includes a structure that a plurality of resistance layers 150 is vertically spaced apart from one another and stacked, and can embody a large resistance in the same area. Thus, an area of a resistance pattern can be reduced and a semiconductor device of high integration can be embodied.

In addition, a resistance of the resistance device may become different according to a selection of the first through sixth plugs 171 through 176. As an alternative to that described above, if the first and fourth plugs 171 and 174 are selected, the resistance device can embody a resistor connected to the first, second and third resistance layers 151, 152 and 153 and may further include the third resistance layer 153. Thus, the resistance device may have a resistance greater than the resistance device described above. In this manner, semiconductor devices in accordance with various embodiments described herein can embody various resistances according to a selection of the plugs.

Also, as described above, the resistance layers 150 can be formed in concurrence with a memory cell. Thus, an additional process is not necessary and a cost of production of a semiconductor device can be lowered.

Figure 4:
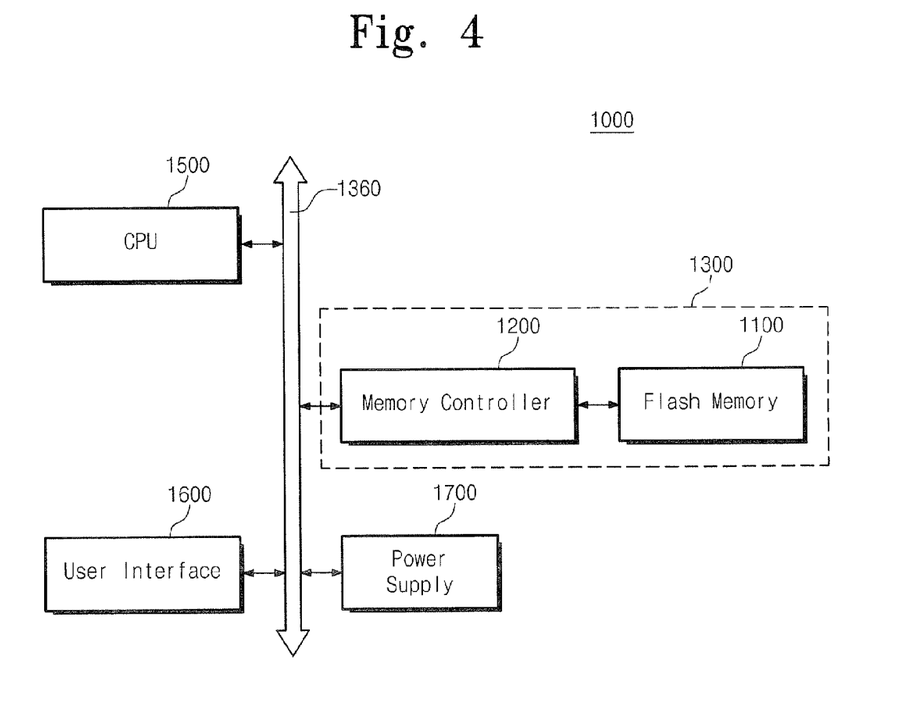
FIG. 4 is a block diagram illustrating a memory system including a semiconductor device in accordance with various embodiments.

FIG. 4 is a block diagram illustrating a memory system including a semiconductor device in accordance with various embodiments described herein.

Referring to FIG. 4, a memory system 1000 includes a memory device 1100 and a memory controller 1200, a central processing unit (CPU) 1500, a user interface 1600 and a power supply 1700 that are electrically connected to a system bus 1360. The memory device 1100 may include a semiconductor device disclosed in any of the embodiments described above.

The memory device 1100 stores data provided from the user interface 1600 and/or processed by the central processing unit (CPU) 1500 through the memory controller 1200. The memory device 1100 may be comprised of a solid state disk (SSD) and in this case, a write speed of the memory system 1000 may become significantly high. A semiconductor device in accordance with various embodiments described herein may be applied to the memory device 1100, the memory controller 1200 and/or the central processing unit (CPU) 1500 described above.

Although not illustrated in the drawing, the memory system may further include an application chipset, a camera image processor and/or a mobile DRAM.

Also, the memory system 1000 may be applied to a PDA, a portable computer, a web tablet, a wireless phone, a mobile phone, a digital music player, a memory card and/or all devices capable of transmitting and/or receiving data in a wireless environment.

A resistance device of a multilayer structure is embodied to reduce an area of the resistance device, thereby providing a semiconductor device of high integration.

A resistance device capable of embodying various resistances is formed to provide a semiconductor device having good quality.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor device comprising:
a semiconductor substrate comprising a first region and a second region;
a first resistance layer and a second resistance layer spaced apart from each other and sequentially stacked on the semiconductor substrate of the first region;
a first plug connected to the first resistance layer;
a second plug connected to the first and second resistance layers in common;
a third plug connected to the second resistance layer; and
a third resistance layer spaced apart from the second resistance layer and stacked on the second resistance layer, wherein the third resistance layer is connected to the third plug.

2. The semiconductor device of claim 1, wherein two plugs among the plugs are connected to each other to provide a resistance device.

3. The semiconductor device of claim 1, wherein the second resistance layer has a width smaller than that of the first resistance layer to expose a portion of the first resistance layer.

4. The semiconductor device of claim 1, wherein the first plug is provided to one end of the first resistance layer.

5. The semiconductor device of claim 4, wherein the second plug is provided to the other end facing the one end of the first resistance layer.

6. A semiconductor device comprising:
a semiconductor substrate comprising a first region and a second region;
a first resistance layer and a second resistance layer spaced apart from each other and sequentially stacked on the semiconductor substrate of the first region;
a first plug connected to the first resistance layer; and
a second plug connected to the first and second resistance layers in common,
wherein the plugs are formed of material having conductivity greater than the resistance layers.

7. A semiconductor device comprising:
a semiconductor substrate comprising a first region and a second region;
a first resistance layer and a second resistance layer spaced apart from each other and sequentially stacked on the semiconductor substrate of the first region;
a first plug connected to the first resistance layer;
a second plug connected to the first and second resistance layers in common; and
a lower select gate, a plurality of control gates and an upper select gate that are sequentially stacked on the semiconductor substrate of the second region, wherein the first resistance layer comprises material provided by the same deposition process as the lower select gate.

8. The semiconductor device of claim 7, further comprising a plurality of other resistance layers formed on the second resistance layer, wherein the uppermost resistance layer among the plurality of other resistance layers comprises material by the same deposition process as the upper select gate.

9. A device comprising:
a substrate;
a first resistance layer and a second resistance layer that are stacked upon one another in spaced-apart relation on the substrate;
a first conductive plug that is connected to the first resistance layer but is free of connection to the second resistance layer;
a second conductive plug that is connected to both the first and second resistance layers;
a third conductive plug that is connected to the second resistance layer but is free of connection to the first resistance layer; and
a third resistance layer that is spaced apart from the second resistance layer and is stacked upon the second resistance layer, wherein the third resistance layer is connected to the third conductive plug.

10. The device of claim 9, wherein two conductive plugs among the first, second and third conductive plugs are selected to provide a resistance device.

11. The device of claim 9, further comprising a lower select gate, a plurality of control gates and an upper select gate that are stacked upon one another on the substrate and are laterally spaced apart from the first and second resistance layers, wherein the first resistance layer and the lower select gate comprise portions of a common layer.

12. The device of claim 11, further comprising a plurality of other resistance layers that are stacked on the second resistance layer, wherein an uppermost resistance layer among the plurality of other resistance layers and the upper select gate comprise portions of a common layer.

13. A device comprising:
a substrate;
first, second and third resistance layers that are stacked upon one another in spaced-apart relation on the substrate, the second resistance layer being narrower than the first resistance layer so as to expose a portion of the first resistance layer, and the third resistance layer being narrower than the second resistance layer so as to expose a portion of the second resistance layer;
a first conductive plug that is connected to the exposed portion of the first resistance layer and to the second resistance layer but is free of connection to the third resistance layer; and
a second conductive plug that is connected to the exposed portion of the second resistance layer and to the third resistance layer but is free of connection to the first resistance layer.

14. The device of claim 13 wherein the first and second conductive plugs are on opposite ends of the second resistance layer, respectively.

15. The device of claim 13 further comprising a lower select gate, a plurality of control gates and an upper select gate that are stacked upon one another in spaced-apart relation on the substrate and laterally spaced apart from the first, second and third resistance layers, wherein the first resistance layer and the lower select gate comprise portions of a common layer.

16. The device of claim 13 further comprising a lower select gate, a plurality of control gates and an upper select gate that are stacked upon one another in spaced-apart relation on the substrate and laterally spaced apart from the first, second and third resistance layers, wherein the third resistance layer and the upper select gate comprise portions of a common layer.

* * * * *